(12) United States Patent
Liu (10) Patent No.: US 10,446,087 B2
(45) Date of Patent: Oct. 15, 2019

(54) GOA DRIVING UNIT

(71) Applicant: Shenzhen China Star Optoelectronics Technology Co., Ltd., Shenzhen, Guangdong (CN)

(72) Inventor: Xujun Liu, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 133 days.

(21) Appl. No.: 15/328,937

(22) PCT Filed: Jan. 6, 2017

(86) PCT No.: PCT/CN2017/070420
§ 371 (c)(1),
(2) Date: Nov. 9, 2017

(87) PCT Pub. No.: WO2018/040465
PCT Pub. Date: Mar. 8, 2018

(65) Prior Publication Data
US 2018/0336834 A1    Nov. 22, 2018

(30) Foreign Application Priority Data
Aug. 30, 2016 (CN) .......................... 2016 1 0770464

(51) Int. Cl.
*G09G 3/34* (2006.01)
*H01L 33/00* (2010.01)

(52) U.S. Cl.
CPC .............. *G09G 3/34* (2013.01); *H01L 33/00* (2013.01)

(58) Field of Classification Search
None
See application file for complete search history.

(56) References Cited

U.S. PATENT DOCUMENTS

2007/0035505 A1    2/2007  Lin et al.
2015/0310819 A1*  10/2015  Xiao ................. G11C 19/28
                                                345/212
(Continued)

FOREIGN PATENT DOCUMENTS

CN    101661798 A    3/2010
CN    103985363 A    8/2014
(Continued)

OTHER PUBLICATIONS

International Search Report for International Application No. PCT/CN2017/070420, dated May 27, 2017.
(Continued)

*Primary Examiner* — Crystal L Hammond (57) ABSTRACT

The present disclosure provides a GOA driving unit, which comprises: a pull-up control module; a pull-up/stage transmission module connected with the present-stage of pull-up control module; a pull-down module respectively connected with a scanning signal output end and a pull-up control signal input end of the present-stage of pull-up/stage transmission module; a bootstrap module respectively connected with the scanning signal output end and the pull-up control signal input end of the present-stage of pull-up/stage transmission module; and a pull-down maintenance module.

7 Claims, 6 Drawing Sheets (56) References Cited

U.S. PATENT DOCUMENTS

| 2016/0125828 | A1* | 5/2016 | Xiao | G09G 3/3677 |
| | | | | 345/214 |
| 2016/0171949 | A1* | 6/2016 | Dai | G09G 3/3677 |
| 2016/0284304 | A1* | 9/2016 | Dai | G09G 3/36 |
| 2016/0307531 | A1* | 10/2016 | Xiao | G09G 3/3677 |

FOREIGN PATENT DOCUMENTS

| CN | 104008741 A | 8/2014 |
| CN | 104008742 A | 8/2014 |
| CN | 104050941 A | 9/2014 |
| CN | 104299583 A | 1/2015 |
| CN | 104766575 A | 7/2015 |
| CN | 105161060 A | 12/2015 |
| CN | 106205458 A | 12/2016 |

OTHER PUBLICATIONS

Office Action and Search Report for Chinese Patent Application No. 201610770464.X dated Jan. 11, 2018.

\* cited by examiner

GOA DRIVING UNIT

CROSS-REFERENCE TO RELATED APPLICATIONS

The present application claims the priority of Chinese patent application CN201610770464.X, entitled "GOA driving unit" and filed on Aug. 30, 2016, the entirety of which is incorporated herein by reference.

FIELD OF THE INVENTION

The present disclosure relates to the technical field of display control, and particularly to a GOA driving unit.

BACKGROUND OF THE INVENTION

GOA (Gate Driver On Array, i.e., a scanning driver integrated on an array substrate) is a gate row drive circuit integrated on the array substrate through a manufacturing procedure of an array. In a GOA circuit, a gate drive chip originally disposed on the array substrate is not needed, so that the manufacture cost can be reduced and the drive circuit can be formed within a panel frame.

In an existing GOA circuit, each stage of circuit includes multiple working modules. As the panel size and the number of gate drive rows increase, the load of the GOA circuit also increases. As a result, the size of the switching element TFT and the panel frame would be increased, and meanwhile, a power consumption of the GOA circuit is increased accordingly.

SUMMARY OF THE INVENTION

In order to solve the above problem, the present disclosure provides a GOA driving unit for decreasing the GOA layout design and the circuit power consumption.

According to one embodiment of the present disclosure, a GOA driving unit is provided, which comprises:

a pull-up control module, used for outputting a pull-up control signal based on a previous-stage of scanning signal;

a pull-up/stage transmission module, connected with the present-stage of pull-up control module and used for outputting a scanning signal based on the pull-up control signal and a clock signal, wherein the output scanning signal serves as an input signal of a next-stage of pull-up control module;

a pull-down module, respectively connected with a scanning signal output end and a pull-up control signal input end of the present-stage of pull-up/stage transmission module, and used for pulling down a present-stage of pull-up control signal and the output scanning signal to a negative electric potential under an action of scanning signals of next two stages and a constant-voltage negative electric potential signal;

a bootstrap module, respectively connected with the scanning signal output end and the pull-up control signal input end of the present-stage of pull-up/stage transmission module, and used for boosting an electric potential of the pull-up control signal input end; and a pull-down maintenance module, wherein the GOA driving units of two adjacent stages share one pull-down maintenance module, and the pull-down maintenance module is respectively connected with the scanning signal output ends of the pull-up/stage transmission modules of the GOA driving units of two adjacent stages and the pull-up control signal input end of the pull-up/stage transmission module of one of the GOA units, and maintains the pull-up control signals and the scanning signals of the pull-up/stage transmission modules of the GOA driving units of two adjacent stages at the negative electric potential under an action of a first applied control signal, a second applied control signal and the constant-voltage negative electric potential signal.

According to one embodiment of the present disclosure, the pull-down maintenance module comprises:

a maintenance control sub-module, respectively connected with the scanning signal output ends of the pull-up/stage transmission modules of the GOA driving units of two adjacent stages, the pull-up control signal input end of one of the GOA driving units, the first applied control signal, the second applied control signal and the constant-voltage negative electric potential signal;

a first pull-down maintenance sub-module, respectively connected with the scanning signal output end and the pull-up control signal input end of the pull-up/stage transmission module of one of the GOA driving units of two adjacent stages, the maintenance control sub-module and the constant-voltage negative electric potential signal; and a second pull-down maintenance sub-module, respectively connected with the scanning signal output end and the pull-up control signal input end of the pull-up/stage transmission module of the other one of the GOA driving units of two adjacent stages, the maintenance control sub-module and the constant-voltage negative electric potential signal.

According to one embodiment of the present disclosure, the maintenance control sub-module and the first pull-down maintenance sub-module are disposed in an odd-numbered row scanning line GOA driving unit of the GOA driving units of two adjacent stages, the second pull-down maintenance sub-module is disposed in an even-numbered row scanning line GOA driving unit next to the odd-numbered row scanning line GOA driving unit, and the maintenance control sub-module is connected with the pull-up control signal input end of the pull-up/stage transmission module in the odd-numbered row scanning line GOA driving unit.

According to one embodiment of the present disclosure, the maintenance control sub-module comprises a first transistor, a second transistor, a third transistor, a fourth transistor, a fifth transistor, a sixth transistor, a seventh transistor, an eighth transistor, and a ninth transistor, characterized in that:

a first pole and a second pole of the first transistor, a second pole of the second transistor, and a second pole of the third transistor are connected in parallel with the first applied control signal, and a third pole of the first transistor is respectively connected with a first pole of the second transistor and a second pole of the fourth transistor;

a third pole of the second transistor is respectively connected with a third pole of the third transistor and a second pole of the fifth transistor;

a first pole of the third transistor is connected with the second applied control signal;

the fourth transistor has a third pole connected with the constant-voltage negative electric potential signal, and a first pole connected with the pull-up control signal input end of the pull-up/stage transmission module in the odd-numbered row scanning line GOA driving unit;

the fifth transistor has a first pole connected with the pull-up control signal input end of the pull-up/stage transmission module in the odd-numbered row scanning line GOA driving unit, and a second pole and a third pole respectively connected with the first pull-down maintenance sub-module and the second pull-down maintenance sub-module;

a first pole and a second pole of the sixth transistor, a second pole of the seventh transistor, and a second pole of the eighth transistor are connected in parallel with the second applied control signal, and a third pole of the sixth transistor is respectively connected with a first pole of the seventh transistor and a second pole of the ninth transistor;

a third pole of the seventh transistor is respectively connected with a third pole of the eighth transistor and a third pole of the fifth transistor;

a first pole of the eighth transistor is connected with the first applied control signal; and the ninth transistor has a third pole connected with the constant-voltage negative electric potential signal, and a first pole connected with the pull-up control signal input end of the pull-up/stage transmission module in the odd-numbered row scanning line GOA driving unit.

According to one embodiment of the present disclosure, the first pull-down maintenance sub-module comprises an eleventh transistor, a twelfth transistor, a thirteenth transistor, and a fourteenth transistor, the eleventh transistor has a first pole respectively connected with a first pole of the twelfth transistor and the second pole of the fifth transistor, a second pole connected with the pull-up control signal input end of the pull-up/stage transmission module in the odd-numbered row scanning line GOA driving unit, and a third pole connected with the constant-voltage negative electric potential signal;

the twelfth transistor has a second pole connected with the scanning signal output end in the odd-numbered row scanning line GOA driving unit, and a third pole connected with the constant-voltage negative electric potential signal;

the thirteenth transistor has a first pole respectively connected with a first pole of the fourteenth transistor and the third pole of the fifth transistor, a second pole connected with the pull-up control signal input end of the pull-up/stage transmission module in the odd-numbered row scanning line GOA driving unit; and a third pole connected with the constant-voltage negative electric potential signal; and the fourteenth transistor has a second pole connected with the scanning signal output end in the odd-numbered row scanning line GOA driving unit, and a third pole connected with the constant-voltage negative electric potential signal; and the second pull-down maintenance sub-module comprises a fifteenth transistor, a sixteenth transistor, a seventeenth transistor and an eighteenth transistor, the fifteenth transistor has a first pole respectively connected with a first pole of the sixteenth transistor and the second pole of the fifth transistor, a second pole connected with the pull-up control signal input end of the pull-up/stage transmission module in the even-numbered row scanning line GOA driving unit, and a third pole connected with the constant-voltage negative electric potential signal;

the sixteenth transistor has a second pole connected with the scanning signal output end in the even-numbered row scanning line GOA driving unit, and a third pole connected with the constant-voltage negative electric potential signal;

the seventeenth transistor has a first pole respectively connected with a first pole of the eighteenth transistor and the third pole of the fifth transistor, a second pole connected with the pull-up control signal input end of the pull-up/stage transmission module in the even-numbered row scanning line GOA driving unit, and a third pole connected with the constant-voltage negative electric potential signal; and the eighteenth transistor has a second pole connected with the scanning signal output end in the even-numbered row scanning line GOA driving unit, and a third pole connected with the constant-voltage negative electric potential signal.

According to one embodiment of the present disclosure, the constant-voltage negative electric potential comprises a first constant-voltage negative electric potential and a second constant-voltage negative electric potential, characterized in that:

the first constant-voltage negative electric potential is respectively connected with the third pole of the fourth transistor, the third pole of the ninth transistor, the third pole of the twelfth transistor, the third pole of the fourteenth transistor, the third pole of the sixteenth transistor, the third pole of the eighteenth transistor, and the third pole of the transistor which has the first pole connected with the next-stage of scanning signal in the pull-down module;

the second constant-voltage negative electric potential is respectively connected with the third pole of the eleventh transistor, the third pole of the thirteenth transistor, the third pole of the fifteenth transistor, the third pole of the seventeenth transistor, and the third pole of the transistor which has the first pole connected with one after the next-stage of scanning signal in the pull-down module; and the first constant-voltage negative electric potential is higher than the second constant-voltage negative electric potential.

According to one embodiment of the present disclosure, the bootstrap module comprises a capacitor, which has an end connected with the scanning signal output end of the present-stage of pull-up/stage transmission module and the other end connected with the pull-up control signal input end of the present-stage of pull-up/stage transmission module.

According to one embodiment of the present disclosure, the pull-down module comprises two transistors, characterized in that:

one transistor has a first pole connected with the next-stage of scanning signal, a second pole connected with the scanning signal output end of the present-stage of pull-up/stage transmission module, and a third pole connected with the constant-voltage negative electric potential signal; and the other transistor has a first pole connected with one after the next-stage of scanning signal, a second pole connected with the pull-up control signal input end of the present-stage of pull-up/stage transmission module, and a third pole connected with the constant-voltage negative electric potential signal.

According to one embodiment of the present disclosure, the pull-up control module comprises a transistor, which has a first pole and a second pole that are connected with the previous-stage of scanning signal, and a third pole connected with the pull-up control signal input end of the present-stage of pull-up/stage transmission module.

According to one embodiment of the present disclosure, the pull-up/stage transmission module comprises a transistor, which has a first pole connected with the pull-up control module, a second pole connected with the clock signal, and a third pole serving as the present-stage of scanning signal output end.

The present disclosure has the following beneficial effects.

According to the present disclosure, the same pull-down maintenance module is shared by the GOA driving units of two adjacent stages so that the number of transistors and the wiring design can be reduced. Therefore, the GOA layout design space and the circuit consumption can both be reduced.

Other advantages, objectives and features of the present disclosure will be further explained to some extent in the following description, and they will become apparent to some extent for those skilled in the art based on investigation and research on the following description, or may be taught through implementation of the present disclosure. The objectives and other advantages of the present disclosure will be achieved through the structure specifically pointed out in the following description, claims and the accompanying drawings.

BRIEF DESCRIPTION OF THE DRAWINGS

The drawings are provided for further understanding of the technical solutions of the present application or the prior art, and constitute one part of the description. The drawings presenting the embodiments of the present application serve to explain the technical solutions of the present application in conjunction with the embodiments of the present application, rather than to limit the technical solutions of the present application in any manner.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
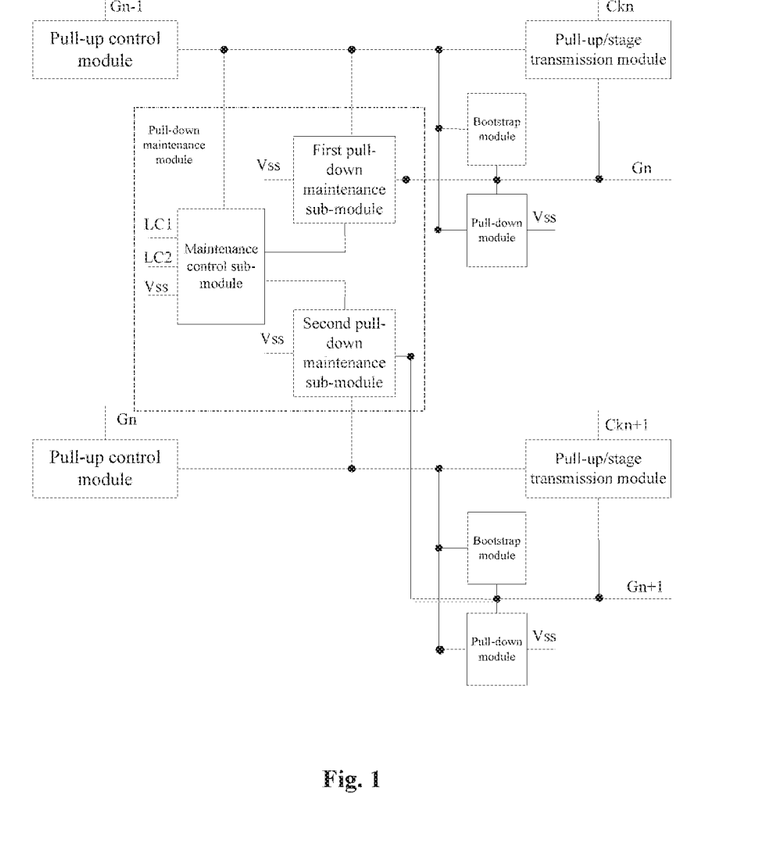
FIG. 1 is a system structure diagram according to one embodiment of the present disclosure.

FIG. 1 is a schematic structural diagram of a GOA driving unit according to one embodiment of the present disclosure. The GOA driving unit comprises a pull-up control module, a pull-up/stage transmission module, a pull-down module, a pull-down maintenance module and a bootstrap module. The pull-up control module outputs a pull-up control signal based on a previous-Mage of scanning signal; the pull-up/stage transmission module is connected with the present-stage of pull-up control module and outputs a scanning signal based on the pull-up control signal and a clock signal, and the output scanning signal serves as an input signal of a next-stage of pull-up control module; the pull-down module is respectively connected with a scanning signal output end and a pull-up control signal input end of the present-stage of pull-up/stage transmission module, and pulls down a present-stage of pull-up control signal and the output scanning signal to a negative electric potential under an action of scanning signals of next two stages and a constant-voltage negative electric potential signal; and the bootstrap module is respectively connected with the scanning signal output end and the pull-up control signal input end of the present-stage of pull-up/stage transmission module, and used for boosting an electric potential of the pull-up control signal input end.

The GOA driving units of two adjacent stages share one pull-down maintenance module, and the pull-down maintenance module is respectively connected with the scanning signal output ends of the pull-up/stage transmission modules of the GOA driving units of two adjacent stages and the pull-up control signal input end of the pull-up/stage transmission module of one of the GOA driving units, and maintains the pull-up control signals and the scanning signals of the pull-up/stage transmission modules of the GOA driving units of two adjacent stages at the negative electric potential under an action of a first applied control signal, a second applied control signal and the constant-voltage negative electric potential signal.

The first applied control signal and the second applied control signal herein are continuous electric potential signals with opposite phases. If the first applied control signal is in a high-level state, the second applied control signal is in a low-level state. After each predetermined number (e.g., 100) of frame images, the high-level signal and low-level signal are interchanged with each other so that some transistors can be prevented from being subjected to a stress for a long time. The present-stage of pull-up control module and the present-stage of pull-up/stage transmission module refer to the pull-up control module and the pull-up/stage transmission module in a same GOA driving unit. The pull-up/stage transmission module outputs a high-level scanning signal under a control of the pull-up control signal and the clock signal, and the scanning signal output end outputs a low-level signal at other time. The stage transmission herein means that the scanning signal is transmitted to the pull-up control module of the next-stage of GOA driving unit.

According to the present disclosure, one pull-down maintenance module is shared by the GOA driving units of two adjacent stages, which is beneficial for decreasing the GOA layout design space in terms of the circuit layout design and reducing the circuit consumption in terms of the circuit operation.

According to one embodiment of the present disclosure, the pull-down maintenance module comprises a maintenance control sub-module, a first pull-down maintenance sub-module and a second pull-down maintenance sub-module, as shown in FIG. 1. The maintenance control sub-module is respectively connected with the scanning signal output ends of the pull-up/stage transmission modules of the GOA driving units of two adjacent stages, the pull-up control signal input end of one of the GOA driving units, the first applied control signal LC1, the second applied control signal LC2 and the constant-voltage negative electric potential signal Vss, and used for generating a signal for controlling the first/second pull-down maintenance modules; the first pull-down maintenance sub-module is respectively connected with the scanning signal output end and the pull-up control signal input end of the pull-up/stage transmission module of one of the GOA driving units of two adjacent stages, the maintenance control sub-module and the constant-voltage negative electric potential signal; and the second pull-down maintenance sub-module is respectively connected with the scanning signal output end and the pull-up control signal input end of the pull-up/stage transmission module of the other one of the GOA driving units of two adjacent stages, the maintenance control sub-module and the constant-voltage negative electric potential signal. The pull-down maintenance module is used for performing pull-down maintenance control on the electric potential signal at the control signal input end of the pull-up/stage transmission module in order to ensure that the low-level is maintained when no scanning signal is output, thereby, facilitating output of a stable scanning signal.

According to one embodiment of the present disclosure, the maintenance control sub-module and the first pull-down maintenance sub-module are disposed in an odd-numbered row scanning line GOA driving unit of the GOA driving units of two adjacent stages, the second pull-down maintenance sub-module is disposed in an even-numbered row scanning line GOA driving unit next to the odd-numbered row scanning line GOA driving unit, and the maintenance control sub-module is connected with the pull-up control signal input end of the pull-up/stage transmission module in the odd-numbered row scanning line GOA driving unit. In this manner, one pull-down maintenance module can be shared by the GOA driving units of two adjacent stages, which can decrease the GOA circuit layout design and is beneficial to the GOA circuit layout.

According to one embodiment of the present disclosure, the maintenance control sub-module comprises a first transistor, a second transistor, a third transistor, a fourth transistor, a fifth transistor, a sixth transistor, a seventh transistor, an eighth transistor and a ninth transistor. It should be noted that, a first pole of each transistor herein represents a gate; and since a source and a drain of the transistor have a same structure, a second pole represents the source or the drain, and a third pole represents the corresponding drain or source. Here, for sake of convenience, besides the gate being the first pole, in the circuit, the pole of the transistor that is on an upper or a left direction is defined as the second pole while the pole on a lower or a right direction is defined as the third pole.

Figure 2:
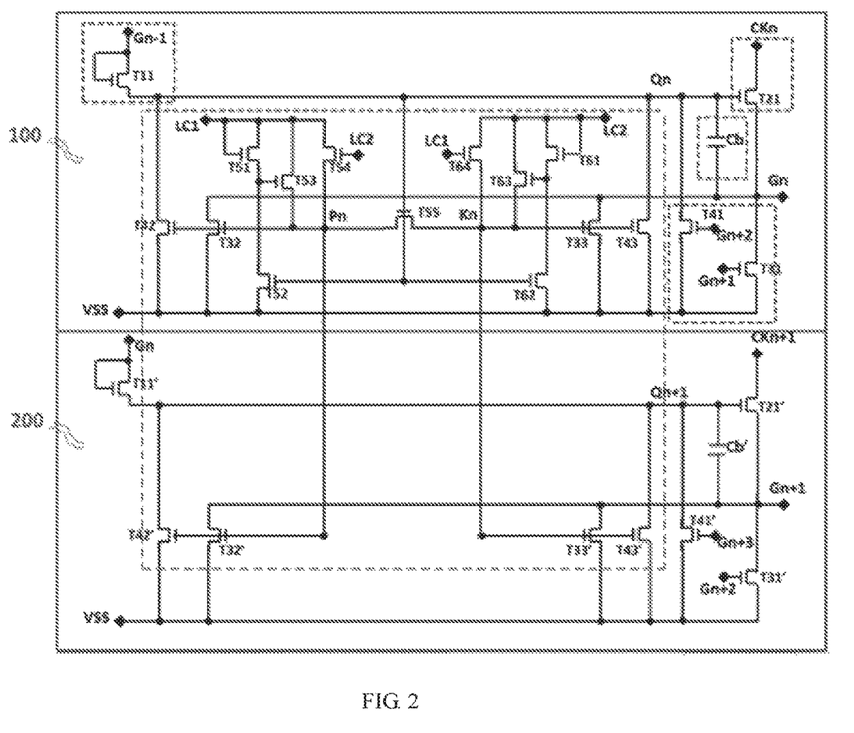
FIG. 2 is a circuit diagram according to one embodiment of the present disclosure.

Specifically, as shown in FIG. 2, a first pole and a second pole of the first transistor T51, a second pole of the second transistor T53, and a second pole of the third transistor T54 are connected in parallel with the first applied control signal LC1, and a third pole of the first transistor T51 is respectively connected with a first pole of the second transistor T53 and a second pole of the fourth transistor T52; a third pole of the second transistor T53 is respectively connected with a third pole of the third transistor T54 and a second pole of the fifth transistor T55; a first pole of the third transistor T54 is connected with the second applied control signal LC2; and the fourth transistor T52 has a third pole connected with the constant-voltage negative electric potential signal Vss, and a first pole connected with the pull-up control signal input end of the pull-up/stage transmission module in the odd-numbered row scanning line GOA driving unit.

The fifth transistor T55 has a first pole connected with the pull-up control signal input end of the pull-up/stage transmission module in the odd-numbered row scanning line GOA driving unit, and a second pole (Point Pn) and a third pole (Point Kn) respectively connected with the first pull-down maintenance sub-module and the second pull-down maintenance sub-module; a first pole and a second pole of the sixth transistor T61, a second pole of the seventh transistor T63, and a second pole of the eighth transistor T64 are connected in parallel with the second applied control signal LC2, and a third pole of the sixth transistor T61 is respectively connected with a first pole of the seventh transistor T63 and a second pole of the ninth transistor T62; a third pole of the seventh transistor T63 is respectively connected with a third pole of the eighth transistor T64 and a third pole of the fifth transistor T55; a first pole of the eighth transistor T64 is connected with the first applied control signal LC1; and the ninth transistor T62 has a third pole connected with the constant-voltage negative electric potential signal Vss, and a first pole connected with the pull-up control signal input end of the pull-up/stage transmission module in the odd-numbered row scanning line GOA driving unit. In this manner, the transistors T51', T52', T53', T54', T55', T61', T62', T63' and T64' in the even-numbered row scanning line GOA driving unit corresponding to the transistors T51, T52, T53, T54, T61, T62, T63 and T64 in the odd-numbered row scanning line GOA driving unit can be eliminated, i.e., 9 elements and a lot of wiring design can be reduced.

According to one embodiment of the present disclosure, as shown in FIG. 2, the first pull-down maintenance sub-module comprises an eleventh transistor, a twelfth transistor, a thirteenth transistor and a fourteenth transistor. The eleventh transistor T42 has a first pole respectively connected with a first pole of the twelfth transistor T32 and the second pole of the fifth transistor T55, a second pole connected with the pull-up control signal input end of the pull-up/stage transmission module in the odd-numbered row scanning line GOA driving unit, and a third pole connected with the constant-voltage negative electric potential signal Vss; the twelfth transistor T32 has a second pole connected with the present-stage scanning signal output end in the odd-numbered row scanning line GOA driving unit, and a third pole connected with the constant-voltage negative electric potential signal Vss; the thirteenth transistor T43 has a first pole respectively connected with a first pole of the fourteenth transistor T33 and the third pole of the fifth transistor T55, a second pole connected with the pull-up control signal input end of the pull-up/stage transmission module in the odd-numbered row scanning line GOA driving unit, and a third pole connected with the constant-voltage negative electric potential signal Vss; and the fourteenth transistor T33 has a second pole connected with the present-stage scanning signal output end in the odd-numbered row scanning line GOA driving unit; and a third pole connected with the constant-voltage negative electric potential signal Vss.

The second pull-down maintenance sub-module comprises a fifteenth transistor, a sixteenth transistor, a seventeenth transistor and an eighteenth transistor. The fifteenth transistor T42' has a first pole respectively connected with a first pole of the sixteenth transistor T32' and the second pole of the fifth transistor T55, a second pole connected with the pull-up control signal input end of the pull-up/stage transmission module in the even-numbered row scanning line GOA driving unit, and a third pole connected with the constant-voltage negative electric potential signal Vss; the sixteenth transistor T32' has a second pole connected with the present-stage scanning signal output end in the even-numbered row scanning line GOA driving unit, and a third pole connected with the constant-voltage negative electric potential signal Vss; the seventeenth transistor T43' has a first pole respectively connected with a first pole of the eighteenth transistor T33' and the third pole of the fifth transistor T55, a second pole connected with the pull-up control signal input end of the pull-up/stage transmission module in the even-numbered row scanning line GOA driving unit, and a third pole connected with the constant-voltage negative electric potential signal Vss; and the eighteenth transistor T33' has a second pole connected with the present-stage scanning signal output end in the even-numbered row scanning line GOA driving unit, and a third pole connected with the constant-voltage negative electric potential signal Vss.

According to one embodiment of the present disclosure, the pull-up control module comprises a transistor, such as T11 in the GOA driving unit 100 and T11' in the GOA driving unit 200. The transistor has a first pole and a second pole that are connected with the previous-stage of scanning signal Gn−1, and a third pole connected with the pull-up control signal input end of the present-stage of pull-up/stage transmission module.

According to one embodiment of the present disclosure, the pull-down module comprises two transistors, such as T31 and T41 in the GOA driving unit 100 and T31' and T41' in the GOA driving unit 200. Taking T31 and T41 in the GOA driving unit 100 as an example, the transistor T31 has a first pole connected with the next-stage of scanning signal Gn+1, a second pole connected with the present-stage of scanning signal output end Gn, and a third pole connected with the constant-voltage negative electric potential signal Vss; and the transistor T41 has a first pole connected with one after the next-stage of scanning signal Gn+2, a second pole connected with the pull-up control signal input end of the pull-up/stage transmission module of the present-stage of GOA driving unit, and a third pole connected with the constant-voltage negative electric potential signal Vss.

According to one embodiment of the present disclosure, the pull-up/stage transmission module comprises a transistor, such as T21 in the GOA driving unit 100 and T21' in the GOA driving unit 200. The transistor has a first pole connected with the pull-up control module, a second pole connected with the clock signal, and a third pole serving as the present-stage of scanning signal output end.

According to one embodiment of the present disclosure, the bootstrap module comprises a capacitor, such as Cb in the GOA driving unit 100 and Cb' in the GOA driving unit 200. The capacitor has an end connected with the present-stage of scanning signal output end, and the other end connected with the pull-up control signal input end of the pull-up/stage transmission module of the same-stage of GOA driving unit.

Figure 5:
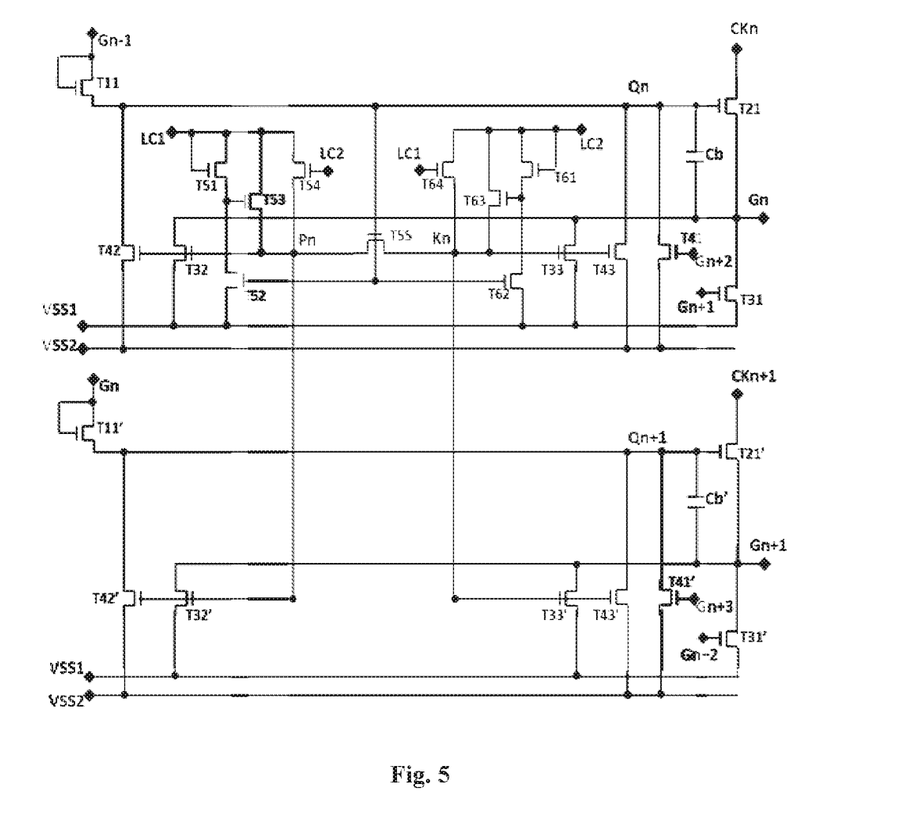
FIG. 5 is a circuit diagram according to another embodiment of the present disclosure.

According to one embodiment of the present disclosure, the constant-voltage negative electric potential comprises a first constant-voltage negative electric potential Vss1 and a second constant-voltage negative electric potential Vss2, as shown in FIG. 5. The first constant-voltage negative electric potential Vss1 is respectively connected with the third pole of the fourth transistor T52, the third pole of the ninth transistor T62, the third pole of the twelfth transistor T32, the third pole of the fourteenth transistor T33, the third pole of the sixteenth transistor T32', the third pole of the eighteenth transistor T33', and the third pole of the transistor which has the first pole connected to the next-stage of scanning signal in the pull-down module. The second constant-voltage negative electric potential Vss2 is respectively connected with the third pole of the eleventh transistor T42, the third pole of the thirteenth transistor T43, the third pole of the fifteenth transistor T42', the third pole of the seventeenth transistor T43', and the third pole of the transistor which has the first pole connected with one after the next-stage of scanning signal in the pull-down module. The first constant-voltage negative electric potential Vss1 is higher than the second constant-voltage negative electric potential Vss2. Through setting the two negative electric potentials (i.e., the first constant-voltage negative electric potential and the second constant-voltage negative electric potential), the Vgs of the four transistors T52, T62, T21 and T21' can be made lower than 0 so as to reduce the leakage effect of these transistors when Qn and Qn+1 are pulled down to a lower electric potential during inoperation procedure.

Figure 3:
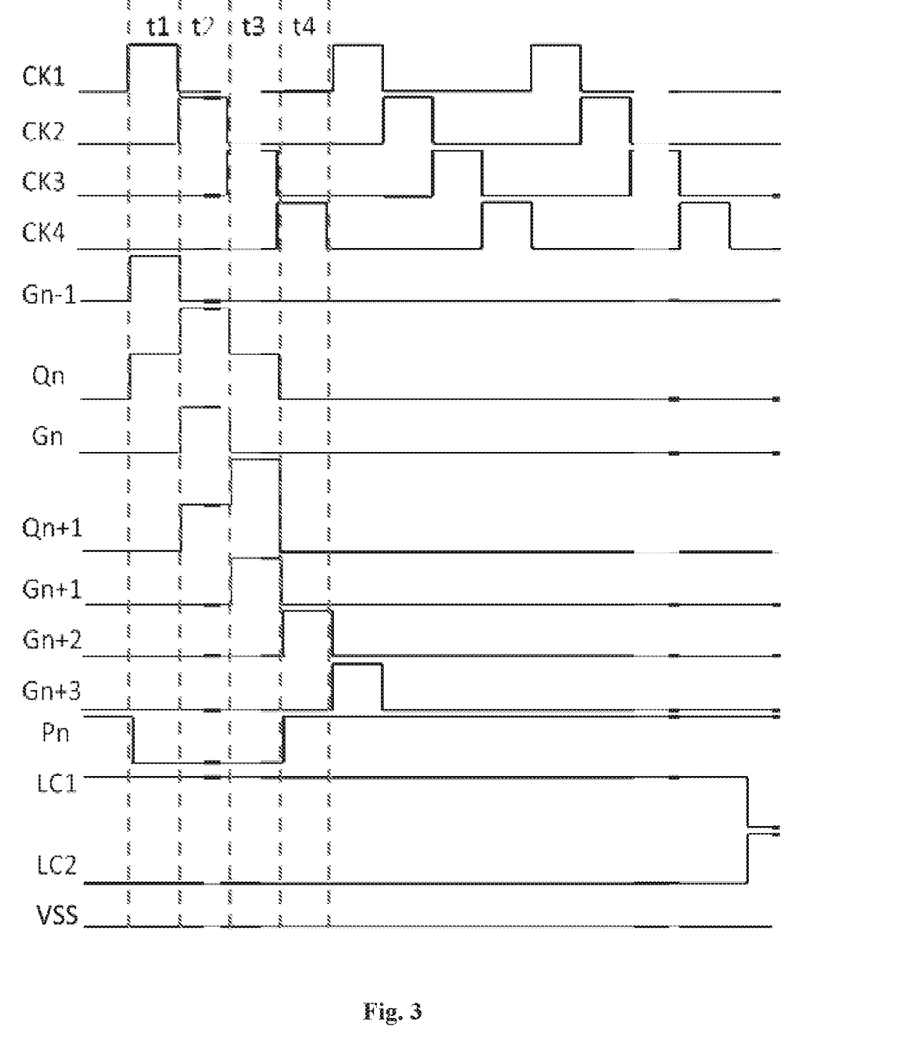
FIG. 3 is a diagram of working statuses of the circuit at various stages corresponding to FIG. 2.
Figure 4A:
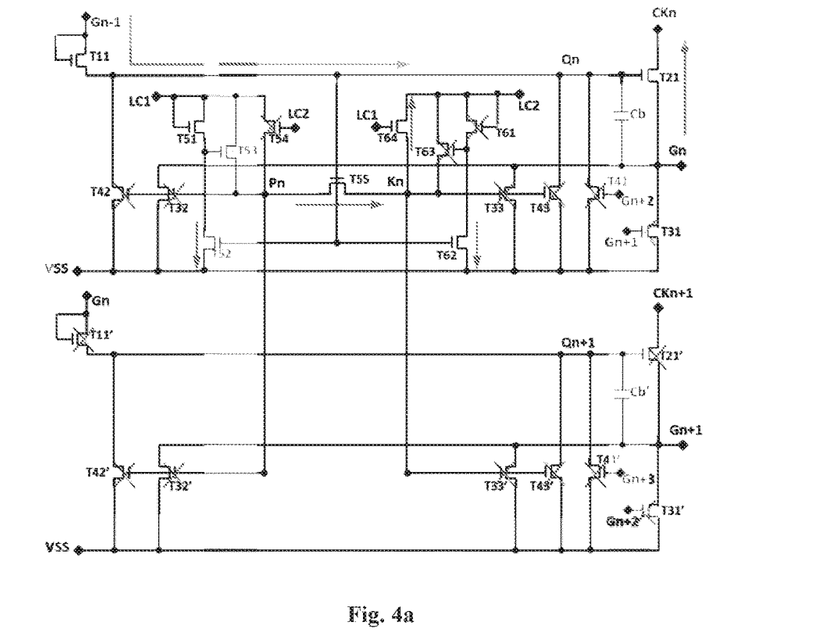
FIGS. 4a-4d are diagrams of working statuses of elements in the circuit at the various stages corresponding to FIG. 3.
Figure 4B:
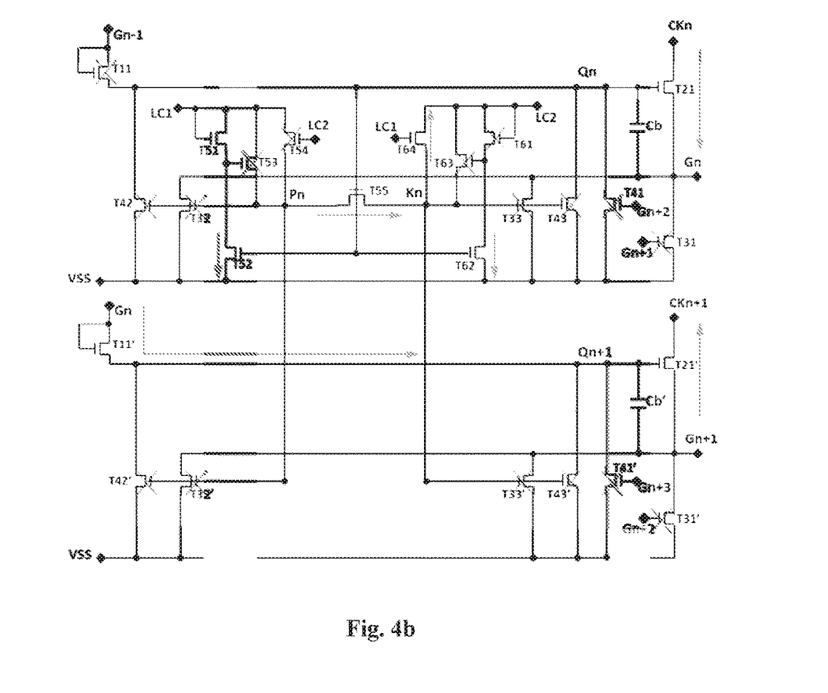
Figure 4C:
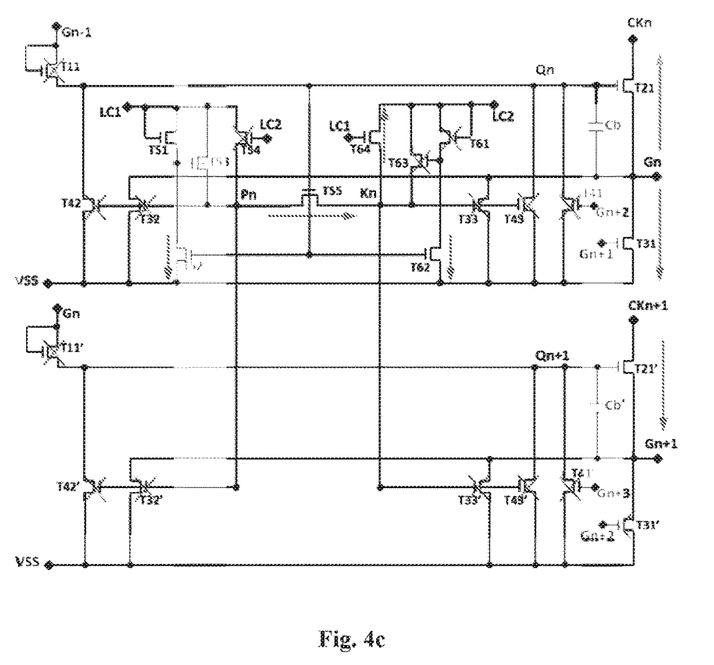

Hereinbelow, the circuit shown in FIG. 2 will be taken as an example to describe in detail the working procedure of the GOA driving unit according to the present disclosure. FIG. 3 is a diagram of working statuses of the circuit shown in FIG. 2 at four stages, and FIGS. 4a-4c are diagrams of signal flow directions corresponding to the stages. The present disclosure will be described in detail hereinafter with reference to FIG. 3 and FIGS. 4a-4d as an example.

Specifically, FIG. 4a corresponds to a first stage t1 in FIG. 3. At this time, the transistors T11, T21, T55, T51, T64, T52 and T62 are all turned on, and other transistors are all turned off. A point Qn is precharged to a high-level state, and the corresponding clock signal is CK1. At this time, the clock signal CKn is in a low-level state. Gn−1 outputs a high-level signal, while Gn outputs a low-level signal. Meanwhile, LC1 supplies a high-level signal; LC2 supplies a low-level signal; VSS supplies a constant negative voltage signal; and LC1 and LC2 only alternately change between the hi h-level state and low-level state at intervals.

FIG. 4b corresponds to a second stage t2 in FIG. 3. At this time, the transistors T11', T21, T21', T55, T51, T64, T52 and T62 are all turned on, and other transistors are all turned off. The corresponding clock signal is CK2. At this time, the clock signal CKn is in a high-level state. Gn−1 outputs a low-level signal, while Gn outputs a high-level signal. The point Qn is boosted to a higher electric potential through the capacitor Cb, and meanwhile, the point Qn+1 is precharged to a high-level state. Meanwhile, the clock signal CKn+1 is in a low-level state, and the Gn+1 outputs a low-level signal.

FIG. 4c corresponds to a third stage t3 in FIG. 3. At this time, the transistors T21, T21', T31, T55, T51, T64, T52 and T62 are all turned on, and other transistors are all turned off. The corresponding clock signal is CK3. At this time, the clock signal CKn is in a low-level state. Gn is pulled to a low-level state by the transistors T21 and T31. Meanwhile, the clock signal CKn+1 is in a high-level state. Gn+1 outputs a high-level signal, and the point Qn+1 is boosted to a higher electric potential through a capacitor Cb'.

Figure 4D:
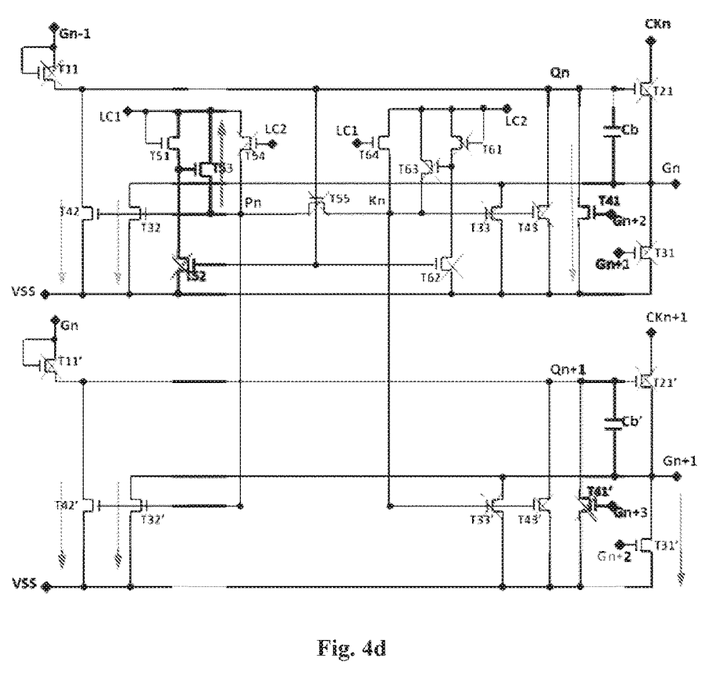

FIG. 4d corresponds to a fourth stage t4 in FIG. 3. At this time, the transistors T31', T51, T53, T64, T41, T32, T42, T32' and T42' are all turned on, and other transistors are all turned off. The corresponding clock signal is CK4. The point Qn is pulled to a low-level state by the transistors T42 and T41; the point Qn+1 is pulled to a low-level state by the transistor T42'; the Gn+1 is pulled to a low-level state by the transistor T31'; and the Gn+2 outputs a high-level signal.

Corresponding to the stages t1-t3, the pull-down maintenance module does not act on the electric potentials of the points Qn and Qn+1, and the whole circuit stably outputs the scanning signal. Corresponding to the stage t4, the pull-down maintenance module pulls down and maintains the low-level state of the points Qn and Qn+1. This is because that the points Qn and Qn+1 are in the low-level state at most of the time during the operation of the whole circuit. Therefore, by providing the pull-down maintenance sub-modules, it can be ensured that the points Qn and Qn+1 are maintained in the low-level state, thereby reducing the effect of a high-frequency signal on the scanning output signal.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:
1. A GOA (Gate Driver On Array) driving unit, comprising:

a pull-up control module, used for outputting a pull-up control signal based on a previous-stage of a scanning signal;

a pull-up/stage transmission module, connected with the present-stage of the pull-up control module and used for outputting a scanning signal based on the pull-up control signal and a clock signal, wherein the output scanning signal serves as an input signal of a next-stage of the pull-up control module;

a pull-down module, respectively connected with a scanning signal output end and a pull-up control signal input end of the present-stage of the pull-up/stage transmission module, and used for pulling down a present-stage of the pull-up control signal and the output scanning signal to a negative electric potential under an action of scanning signals of next two stages and a constant-voltage negative electric potential signal;

a bootstrap module, respectively connected with the scanning signal output end and the pull-up control signal input end of the present-stage of the pull-up/stage transmission module, and used for boosting an electric potential of the pull-up control signal input end; and a pull-down maintenance module, wherein the GOA driving units of two adjacent stages share one pull-down maintenance module, and the pull-down maintenance module is respectively connected with the scanning signal output ends of the pull-up/stage transmission modules of the GOA driving units of two adjacent stages and the pull-up control signal input end of the pull-up/stage transmission module of one of the GOA units, and maintains the pull-up control signals and the scanning signals of the pull-up/stage transmission modules of the GOA driving units of two adjacent stages at the negative electric potential under an action of a first applied control signal, a second applied control signal and the constant-voltage negative electric potential signal;

wherein, the pull-down maintenance module comprises:

a maintenance control sub-module, respectively connected with the scanning signal output ends of the pull-up/stage transmission modules of the GOA driving units of two adjacent stages, the pull-up control signal input end of one of the GOA driving units, the first applied control signal, the second applied control signal and the constant-voltage negative electric potential signal;

a first pull-down maintenance sub-module, respectively connected with the scanning signal output end and the pull-up control signal input end of the pull-up/stage transmission module of one of the GOA driving units of two adjacent stages, the maintenance control sub-module and the constant-voltage negative electric potential signal; and a second pull-down maintenance sub-module, respectively connected with the scanning signal output end and the pull-up control signal input end of the pull-up/stage transmission module of the other one of the GOA driving units of two adjacent stages, the maintenance control sub-module and the constant-voltage negative electric potential signal;

wherein, the maintenance control sub-module and the first pull-down maintenance sub-module are disposed in an odd-numbered row scanning line GOA driving unit of the GOA driving units of two adjacent stages, the second pull-down maintenance sub-module is disposed in an even-numbered row scanning line GOA driving unit next to the odd-numbered row scanning line GOA driving unit, and the maintenance control sub-module is connected with the pull-up control signal input end of the pull-up/stage transmission module in the odd-numbered row scanning line GOA driving unit;

wherein, the maintenance control sub-module comprises a first transistor, a second transistor, a third transistor, a fourth transistor, a fifth transistor, a sixth transistor, a seventh transistor, an eighth transistor, and a ninth transistor, characterized in that;

a first pole and a second pole of the first transistor, a second pole of the second transistor, and a second pole of the third transistor are connected in parallel with the first applied control signal, and a third pole of the first transistor is respectively connected with a first pole of the second transistor and a second Dole of the fourth transistor;

a third pole of the second transistor is respectively connected with a third pole of the third transistor and a second pole of the fifth transistor;

a first pole of the third transistor is connected with the second applied control signal;

the fourth transistor has a third pole connected with the constant-voltage negative electric potential signal, and a first pole connected with the pull-up control signal input end of the pull-up/stage transmission module in the odd-numbered row scanning line GOA driving unit;

the fifth transistor has a first pole connected with the pull-up control signal input end of the pull-up/stage transmission module in the odd-numbered row scanning line GOA driving unit, and a second pole and a third pole respectively connected with the first pull-down maintenance sub-module and the second pull-down maintenance sub-module;

a first pole and a second pole of the sixth transistor, a second pole of the seventh transistor, and a second pole of the eighth transistor are connected in parallel with the second applied control signal, and a third pole of the sixth transistor is respectively connected with a first pole of the seventh transistor and a second pole of the ninth transistor;

a third pole of the seventh transistor is respectively connected with a third pole of the eighth transistor and a third pole of the fifth transistor;

a first pole of the eighth transistor is connected with the first applied control signal; and the ninth transistor has a third pole connected with the constant-voltage negative electric potential signal, and a first pole connected with the pull-up control signal input end of the pull-up/stage transmission module in the odd-numbered row scanning line GOA driving unit.

2. The driving unit according to claim 1, wherein the first pull-down maintenance sub-module comprises an eleventh transistor, a twelfth transistor, a thirteenth transistor, and a fourteenth transistor, the eleventh transistor has a first pole respectively connected with a first pole of the twelfth transistor and the second pole of the fifth transistor, a second pole connected with the pull-up control signal input end of the pull-up/stage transmission module in the odd-numbered row scanning line GOA driving unit, and a third pole connected with the constant-voltage negative electric potential signal;

the twelfth transistor has a second pole connected with the scanning signal output end in the odd-numbered row scanning line GOA driving unit, and a third pole connected with the constant-voltage negative electric potential signal;

the thirteenth transistor has a first pole respectively connected with a first pole of the fourteenth transistor and the third pole of the fifth transistor, a second pole connected with the pull-up control signal input end of the pull-up/stage transmission module in the odd-numbered row scanning line GOA driving unit, and a third pole connected with the constant-voltage negative electric potential signal; and the fourteenth transistor has a second pole connected with the scanning signal output end in the odd-numbered row scanning line GOA driving unit, and a third pole connected with the constant-voltage negative electric potential signal; and wherein the second pull-down maintenance sub-module comprises a fifteenth transistor, a sixteenth transistor, a seventeenth transistor and an eighteenth transistor, the fifteenth transistor has a first pole respectively connected with a first pole of the sixteenth transistor and the second pole of the fifth transistor, a second pole connected with the pull-up control signal input end of the pull-up/stage transmission module in the even-numbered row scanning line GOA driving unit, and a third pole connected with the constant-voltage negative electric potential signal;

the sixteenth transistor has a second pole connected with the scanning signal output end in the even-numbered row scanning line GOA driving unit, and a third pole connected with the constant-voltage negative electric potential signal;

the seventeenth transistor has a first pole respectively connected with a first pole of the eighteenth transistor and the third pole of the fifth transistor, a second pole connected with the pull-up control signal input end of the pull-up/stage transmission module in the even-numbered row scanning line GOA driving unit, and a third pole connected with the constant-voltage negative electric potential signal; and the eighteenth transistor has a second pole connected with the scanning signal output end in the even-numbered row scanning line GOA driving unit, and a third pole connected with the constant-voltage negative electric potential signal.

3. The driving unit according to claim 2, wherein the constant-voltage negative electric potential comprises a first constant-voltage negative electric potential and a second constant-voltage negative electric potential, characterized in that:

the first constant-voltage negative electric potential is respectively connected with the third pole of the fourth transistor, the third pole of the ninth transistor, the third pole of the twelfth transistor, the third pole of the fourteenth transistor, the third pole of the sixteenth transistor, the third pole of the eighteenth transistor, and the third pole of the transistor which has the first pole connected with the next-stage of scanning signal in the pull-down module;

the second constant-voltage negative electric potential is respectively connected with the third pole of the eleventh transistor, the third pole of the thirteenth transistor, the third pole of the fifteenth transistor, the third pole of the seventeenth transistor, and the third pole of the transistor which has the first pole connected with one after the next-stage of scanning signal in the pull-down module; and the first constant-voltage negative electric potential is higher than the second constant-voltage negative electric potential.

4. The driving unit according to claim 1, wherein the bootstrap module comprises a capacitor, which has an end connected with the scanning signal output end of the present-stage of pull-up/stage transmission module and the other end connected with the pull-up control signal input end of the present-stage of pull-up/stage transmission module.

5. The driving unit according to claim 1, wherein the pull-down module comprises two transistors, characterized in that:

one transistor has a first pole connected with the next-stage of scanning signal, a second pole connected with the scanning signal output end of the present-stage of pull-up/stage transmission module, and a third pole connected with the constant-voltage negative electric potential signal; and the other transistor has a first pole connected with one after the next-stage of scanning signal, a second pole connected with the pull-up control signal input end of the present-stage of pull-up/stage transmission module, and a third pole connected with the constant-voltage negative electric potential signal.

6. The driving unit according to claim 1, wherein the pull-up control module comprises a transistor, which has a first pole and a second pole that are connected with the previous-stage of scanning signal, and a third pole connected with the pull-up control signal input end of the present-stage of pull-up/stage transmission module.

7. The driving unit according to claim 1, wherein the pull-up/stage transmission module comprises a transistor, which has a first pole connected with the pull-up control module, a second pole connected with the clock signal, and a third pole serving as the present-stage of scanning signal output end.

* * * * *